United States Patent
Okuyama

(10) Patent No.: US 9,426,388 B2
(45) Date of Patent: Aug. 23, 2016

(54) SEMICONDUCTOR DEVICE AND INFRARED IMAGE PICKUP DEVICE PROVIDED WITH SAME

(75) Inventor: Kuniyuki Okuyama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 173 days.

(21) Appl. No.: 14/344,790

(22) PCT Filed: Aug. 23, 2012

(86) PCT No.: PCT/JP2012/071925
§ 371 (c)(1),
(2), (4) Date: Mar. 13, 2014

(87) PCT Pub. No.: WO2013/038911
PCT Pub. Date: Mar. 21, 2013

(65) Prior Publication Data
US 2014/0367573 A1 Dec. 18, 2014

(30) Foreign Application Priority Data
Sep. 15, 2011 (JP) .................................. 2011-201953

(51) Int. Cl.
*H04N 5/33* (2006.01)
*H04N 5/359* (2011.01)
(Continued)

(52) U.S. Cl.
CPC ... *H04N 5/33* (2013.01); *G01J 1/46* (2013.01); *G01J 5/22* (2013.01); *G01J 5/24* (2013.01);
(Continued)

(58) Field of Classification Search
CPC ............. H04N 5/33; H04N 5/359; G01J 5/22; G01J 5/24; G01J 2005/0077; G01J 2005/106
See application file for complete search history.

(56) References Cited

U.S. PATENT DOCUMENTS 5,212,470 A * 5/1993 Thuillard ............... G08B 17/11
                                                          250/381
6,712,506 B2    3/2004 Pantigny
(Continued)

FOREIGN PATENT DOCUMENTS

| JP | 03-190563 | 8/1991 |
| JP | 11-097989 | 4/1999 |
| JP | 2004-512536 | 4/2004 |
| JP | 2008-022457 | 1/2008 |

OTHER PUBLICATIONS

International Search Report, PCT/JP2012/071925, Oct. 9, 2012.

*Primary Examiner* — David Porta
*Assistant Examiner* — Jeremy S Valentiner
(74) *Attorney, Agent, or Firm* — Young & Thompson

(57) ABSTRACT

Provided is an infrared image pickup device, including: a plurality of bolometer elements that receive light from a subject; and a plurality of readout circuits respectively connected to the plurality of bolometer elements, the plurality of bolometer elements and the plurality of readout circuits being connected to a first input voltage wiring and a second input voltage wiring. Each of the plurality of readout circuits includes: a bias circuit that applies a bias voltage to corresponding one of the plurality of bolometer elements; a bias-canceling circuit that removes an offset current of the corresponding one of the plurality of bolometer elements; an integration circuit connected to a connection point between the bias circuit and the bias-canceling circuit, that integrates a differential current between the bias circuit and the bias-canceling circuit; and a saturation-prevention circuit that prevents saturation of an output voltage of the integration circuit.

6 Claims, 8 Drawing Sheets

(51) Int. Cl.
*G01J 1/46* (2006.01)
*G01J 5/22* (2006.01)
*G01J 5/24* (2006.01)
*H01L 27/146* (2006.01)
*G01J 5/00* (2006.01)
*G01J 5/10* (2006.01)

(52) U.S. Cl.
CPC ......... *H04N 5/359* (2013.01); *G01J 2005/0077* (2013.01); *G01J 2005/106* (2013.01); *H01L 27/14669* (2013.01)

(56) References Cited

U.S. PATENT DOCUMENTS

| | | | |
|---|---|---|---|
| 7,663,088 B2 | 2/2010 | Kawano | |
| 7,994,466 B2 | 8/2011 | Kawano | |
| 2002/0022938 A1* | 2/2002 | Butler | G01J 5/061 |
| | | | 702/85 |
| 2003/0001591 A1* | 1/2003 | Pantigny | H04N 5/3559 |
| | | | 324/678 |
| 2008/0048763 A1* | 2/2008 | Kawano | G01J 5/22 |
| | | | 327/535 |
| 2010/0102231 A1 | 4/2010 | Kawano | |

* cited by examiner

SEMICONDUCTOR DEVICE AND INFRARED IMAGE PICKUP DEVICE PROVIDED WITH SAME

TECHNICAL FIELD

This invention relates to a semiconductor device and an infrared image pickup device including the same.

BACKGROUND ART

As an example of an infrared image pickup device, there is known a bolometer infrared image pickup device including a linear or area sensor array and a readout circuit (Patent Literature 1). An example thereof is described below with reference to FIG. 4.

FIG. 4 partially illustrates a readout circuit and an area sensor array in the bolometer infrared image pickup device.

This infrared image pickup device includes thermoelectric conversion elements arranged in a two-dimensional matrix, detects an infrared signal received by the thermoelectric conversion element for each thermoelectric conversion element, and outputs a detection signal as an electric signal. This infrared image pickup device can perform parallel processing of the detection signals by pixel switches 201 selected by a vertical shift register 205 via a scanning line 211, and a readout circuit 206 connected to thermoelectric conversion elements 202 via a horizontal switch 204 and a signal line 203. Outputs of a plurality of readout circuits 206 are sequentially output to the outside from an output terminal 210 by a horizontal shift register 208. Reference numerals 207 and 209 denote a multiplexer switch and an output buffer, respectively.

A structure of the readout circuit of FIG. 4 is illustrated in FIG. 5. A readout circuit 101 includes a bias circuit 102 for applying a constant voltage to a bolometer element (thermoelectric conversion element) 105, a bias-canceling circuit 103 for removing offset currents of components other than a signal of a subject, and an integration circuit 104 including an operational amplifier (hereinafter referred to as an integration operational amplifier) 111 connected to both the bias circuit 102 and the bias-canceling circuit 103. The plurality of readout circuits 101 are supplied with an input voltage via input voltage wirings 1 and 2 (106 and 107) so as to perform reading operation simultaneously in parallel.

The operation is generally as follows. A variation of resistance of each bolometer element 105 is generated in accordance with intensity of infrared incident light from the subject and is detected as a difference between a bolometer current and a bias cancel current determined by input voltages VB1 and VB2 (115 and 121). The detected current difference is integrated by the integration circuit 104 and simultaneously undergoes current-to-voltage conversion to be output as a voltage value.

Specific operations of the bias circuit 102 and the bias-canceling circuit 103 are as follows. First, the input voltages VB1 and VB2 are adjusted in a state where a shutter of the image pickup device is closed (without incident light from the subject). Thus, a current flowing in the bolometer element 105 is balanced with a current flowing in a bias-canceling resistor 116. After that, the shutter is opened so as to extract only a current that has been varied due to resistance variation of the bolometer element 105 caused by the incident light from the subject. Details of individual circuits of FIG. 5 are described below.

First, the bias circuit 102 includes an NMOS transistor (hereinafter referred to as a bias transistor) 108 having a source connected to one terminal of the bolometer element 105, and a source follower circuit 109 having an input terminal connected to the input voltage wiring 1 (106) and an output terminal connected to a gate of the bias transistor 108. Because the source follower circuit 109 drives the bias transistor 108 with low impedance, intrusive noise in each readout circuit can be suppressed. The bias circuit 102 applies a constant voltage to each bolometer element 105. Thus, the resistance variation of the bolometer element 105 is converted into a current value.

Further, a VGS removing voltage generation circuit 1 (110) is a circuit that compensates a gate-source voltage (VGS) of each of the bias transistor 108 and a transistor in the source follower circuit 109 and has a circuit structure in which a voltage variation of VGS does not appear in a drain current (compensation of voltage variation). More specifically, the VGS removing voltage generation circuit 1 (110) includes the bias transistor 108 and the source follower circuit 109 that are the same as those of the bias circuit 102, and an operational amplifier 114. Connections are made as follows. A source of the bias transistor 108 is connected to one terminal of the bolometer element 105. A gate of the bias transistor 108 is connected to an output terminal of the source follower circuit 109, and a drain of the bias transistor 108 is connected to +5 V. The operational amplifier 114 has an output terminal connected to an input terminal of the source follower circuit 109, an inverting input terminal (−) connected to the source of the bias transistor 108, and a non-inverting input terminal (+) connected to the input voltage VB1 (115).

Similarly, the bias-canceling circuit 103 includes the resistor element (bias-canceling resistor) 116 having one terminal connected to a power source, a PMOS transistor (hereinafter referred to as a canceler transistor) 117 having a source connected to the other terminal of the resistor element, and a source follower circuit 118 having an input terminal connected to the input voltage wiring 2 (107) and an output terminal connected to a gate of the canceler transistor 117.

Here, an infrared signal has a large offset component, and a signal component from the subject with a very small level exists on the offset component. Therefore, this bias-canceling circuit 103 is constituted for a purpose of removing the offset component. In addition, because the source follower circuit 118 drives the canceler transistor 117 with low impedance, intrusive noise in each readout circuit 101 can be suppressed.

In addition, similarly to the VGS removing voltage generation circuit 1 (110), a VGS removing voltage generation circuit 2 (119) is also a circuit for compensating VGS of each of the canceler transistor 117 and a transistor in the source follower circuit 118. More specifically, the VGS removing voltage generation circuit 2 (119) also includes the bias-canceling resistor 116, the canceler transistor 117, the source follower circuit 118 that are the same as those of the bias-canceling circuit 103, and an operational amplifier 120. Connections are made as follows. A source of the canceler transistor 117 is connected to one terminal of the bias-canceling resistor 116. A gate of the canceler transistor 117 is connected to an output terminal of the source follower circuit 118. A drain of the canceler transistor 117 is connected to +5 V. The operational amplifier 120 has an output terminal connected to an input terminal of the source follower circuit 118, an inverting input terminal (−) connected to the source of the canceler transistor 117, and a non-inverting input terminal (+) connected to the input voltage terminal VB2 (121).

Drains of the bias transistor 108 and the canceler transistor 117 in the readout circuit 101 are connected to the inverting input terminal (−) of the integration operational amplifier 111 and one terminal of an integration capacitor 122, which are provided in the integration circuit 104. The integration circuit 104 integrates current variation of the bolometer element 105 described above.

The other terminal of the integration capacitor 122 is connected to an output terminal of the integration operational amplifier 111, and a non-inverting input terminal (+) of the integration operational amplifier 111 is connected to +5 V. Thus, the inverting input terminal (−) of the integration operational amplifier 111, namely the drains of the bias transistor 108 and the canceler transistor 117 are usually fixed to +5 V. A voltage of the integration capacitor 122 after the integration is extracted from the output terminal of the integration operational amplifier 111 and is sequentially output as an output signal from each readout circuit 101. In addition, a resetting switch 123 is disposed between the inverting input terminal (−) and the output terminal of the integration operational amplifier 111. After outputting the integrated voltage from the integration capacitor 122, the switch 123 is turned on so that the drains of the bias transistor 108 and the canceler transistor 117 are set to +5 V that is the voltage of the non-inverting input terminal (+) of the integration operational amplifier 111.

A clipping diode A (124) and a clipping diode B (125) are connected to the inverting input terminal (−) of the integration operational amplifier 111. When one of a current flowing in the bolometer element 105 and a current flowing in the bias-canceling circuit 103 becomes excess so that an output of the integration operational amplifier 111 is saturated, these diodes function to compensate the excess current.

Next, a mechanism of high temperature aliasing and temperature drift is described with reference to FIGS. 6A and 6B.

In FIG. 6A, the input voltage wirings connected to the plurality of readout circuits and the bias transistor or the canceler transistor are directly connected, and hence there is a problem in that the input voltage is effected by a voltage change inside the readout circuit when light enters from a high temperature subject. The drain voltage of each transistor described above is usually fixed to +5 V. However, when light enters the bolometer element (thermoelectric conversion element) from a high temperature subject, the voltage may change. When light enters from a high temperature subject, a resistance of the bolometer element is decreased. Therefore, in the case where the current supplied to the bolometer element increases, the current flows rapidly from a capacitor in the integration operational amplifier to the bolometer element through a path indicated by an arrow in the circuit on the right side of FIG. 6A at an instant when a resetting switch RSTSW (the switch 123 of FIG. 5) is turned off in starting the integration. As a result, an imaginary short of the operational amplifier is lost, and a voltage variation occurs at the inverting input terminal (−) of the integration operational amplifier (period t1 of FIG. 6B).

After that, also when the output of the integration operational amplifier is saturated, the imaginary short of the operational amplifier is lost, and the voltage at the inverting input terminal (−) of the integration operational amplifier is ultimately decreased from +5 V to approximately +4.3 V as a clipping voltage (period t1' of FIG. 6B). In such a voltage variation of the inverting input terminal (−), the drain voltages of the bias transistor and the canceler transistor are decreased. Therefore, the gate voltages of the transistors also vary due to parasitic capacitance between the drain and the gate thereof, and hence a voltage variation occurs in each input voltage wiring connected to each gate.

Therefore, when light from a high temperature subject enters some bolometer elements, because of the influence of the voltage variation (intrusive noise) described above, a displacement current is generated in every readout circuit via the input voltage wiring 1 and the input voltage wiring 2. The generated displacement current affects output voltages of other bolometer elements which light does not enter from a high temperature subject.

As a countermeasure thereagainst, the image pickup device of Patent Literature 1 uses source follower circuits (109 and 118 of FIG. 5) and drives a bias transistor and a canceler transistor at low impedance, so as to suppress a variation of the gate voltage due to high temperature aliasing.

CITATION LIST

Patent Literature 1: JP-A-2008-22457

SUMMARY OF THE INVENTION

Problem to be Solved by the Invention

The bolometer infrared image pickup device described above has the following problem. The source follower circuits are used as input circuits of the bias transistor and the canceler transistor, and hence each transistor is driven at low impedance so that intrusive noise due to a high temperature subject or the like is prevented. Therefore, an area of the source follower circuits and power consumption thereof are large.

This problem is due to a fact that the infrared signal is very small, and the source follower circuit is thus required to realize low noise. Specifically, it is required for the source follower circuit to have a large area for reducing an influence of 1/f noise, and to have an increased mutual conductance gm of the transistor for reducing white noise. For this reason, power consumption of the source follower circuit is large. Because two source follower circuits are disposed for each of the readout circuits, the area and power consumption of the entire chip are large.

This invention aims to realize low noise, a small area, and low power consumption in a semiconductor device for an infrared image pickup device.

Means to Solve the Problem

According to one aspect of this invention, there is provided a semiconductor device, including at least one set of combinations of: a bolometer element that receives light from a subject; a bias circuit that applies a bias voltage to the bolometer element; a bias-canceling circuit that removes an offset current of the bolometer element; an integration circuit connected to a connection point between the bias circuit and the bias-canceling circuit, that integrates a differential current between the bias circuit and the bias-canceling circuit; and a saturation-prevention circuit that prevents saturation of an output voltage of the integration circuit.

According to another aspect of this invention, there is provided an infrared image pickup device, including: a plurality of bolometer elements that receive light from a subject; and a plurality of readout circuits respectively connected to the plurality of bolometer elements, the plurality of bolometer elements and the plurality of readout circuits being connected to a first input voltage wiring and a second input voltage wiring. Each of the plurality of readout circuits includes: a bias circuit that applies a bias voltage to corresponding one of the plurality of bolometer elements; a bias-canceling circuit that removes an offset current of the corresponding one of the plurality of bolometer elements; an integration circuit connected to a connection point between the bias circuit and the bias-canceling circuit, that integrates a differential current between the bias circuit and the bias-canceling circuit; and a saturation-prevention circuit that prevents saturation of an output voltage of the integration circuit.

According to still another aspect of this invention, there is provided a method of preventing saturation of an output voltage of an integration circuit in an infrared image pickup device, the infrared image pickup device including: a plurality of bolometer elements that receive light from a subject; and a plurality of readout circuits respectively connected to the plurality of bolometer elements, the plurality of bolometer elements and the plurality of readout circuits being connected to a first input voltage wiring and a second input voltage wiring, each of the plurality of readout circuits including: a bias circuit that applies a bias voltage to corresponding one of the plurality of bolometer elements; a bias-canceling circuit that removes an offset current of the corresponding one of the plurality of bolometer elements; and an integration circuit connected to a connection point between the bias circuit and the bias-canceling circuit, that integrates a differential current between the bias circuit and the bias-canceling circuit. The method of preventing saturation of the output voltage includes: comparing the output voltage of the integration circuit with a preset saturation prevention upper detection voltage; and separating the integration circuit from the connection point when the output voltage of the integration circuit is higher than the preset saturation prevention upper detection voltage, thereby preventing saturation of the output voltage of the integration circuit.

Effect of the Invention

In the semiconductor device according to this invention, the saturation-prevention circuit prevents saturation of an output voltage of the integration circuit. Thus, the semiconductor device according to this invention can realize, without the source follower circuits, the same performance as in a device including the source follower circuits, with low noise, a small area, and low power consumption.

In the infrared image pickup device according to this invention, the saturation-prevention circuit can prevent saturation of an output voltage of the integration circuit, and can eliminate a voltage variation component of the input voltage wiring due to a high temperature subject or the like. Thus, the infrared image pickup device according to this invention can eliminate the influence of the saturation phenomenon of an output voltage of the integration circuit on the input voltage supplied to other readout circuits that operate in parallel. Therefore, it is possible to obtain the same effect of preventing high temperature aliasing as in the case where the source follower circuits are used. As a result, the infrared image pickup device according to this invention can realize low noise, a small area, and low power consumption.

DETAILED DESCRIPTION OF EXEMPLARY EMBODIMENT

Structure of Embodiment

Figure 1:
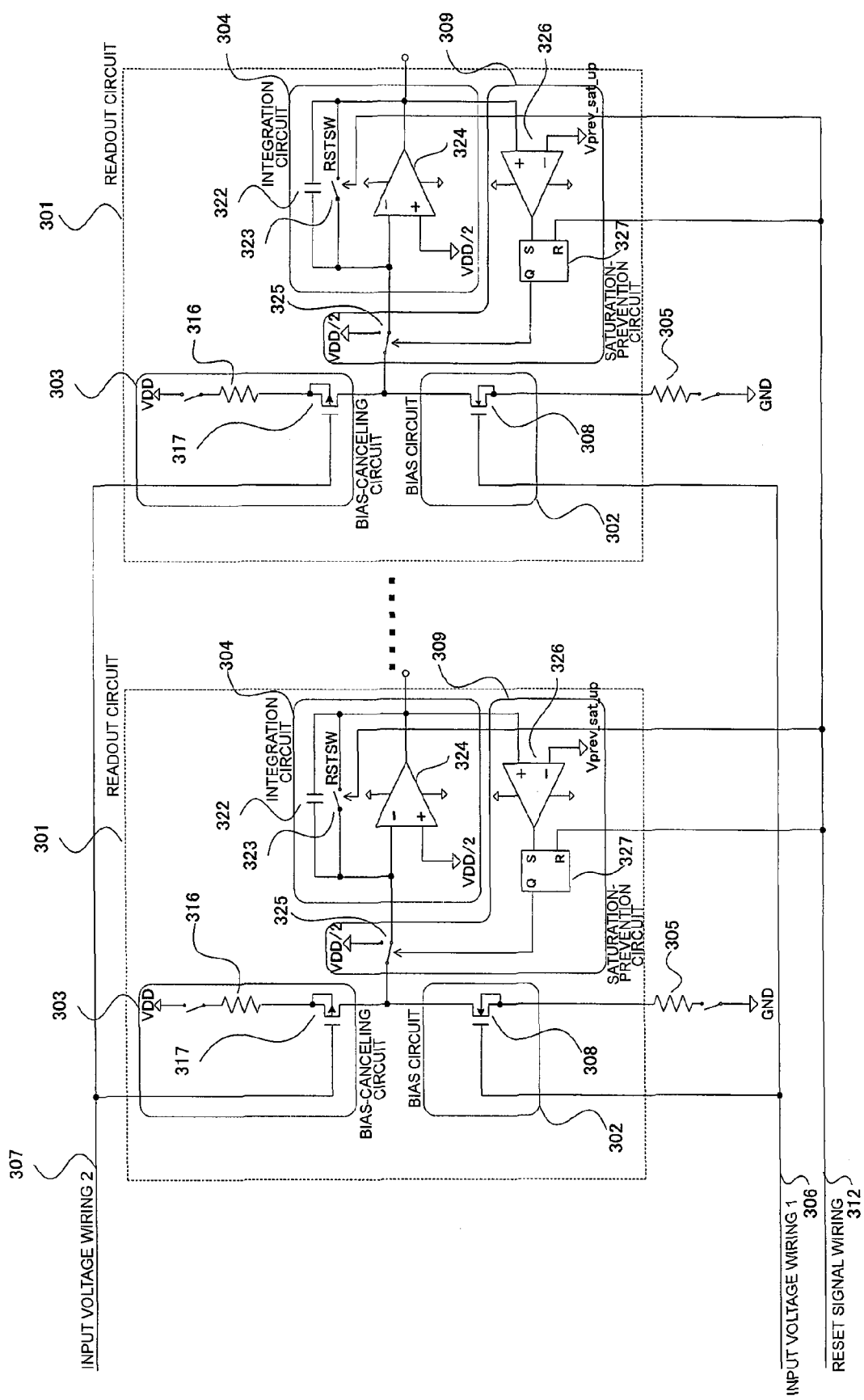
FIG. 1 is a diagram illustrating a structure of a readout circuit in a bolometer infrared image pickup device according to a first embodiment of this invention.
Figure 5:
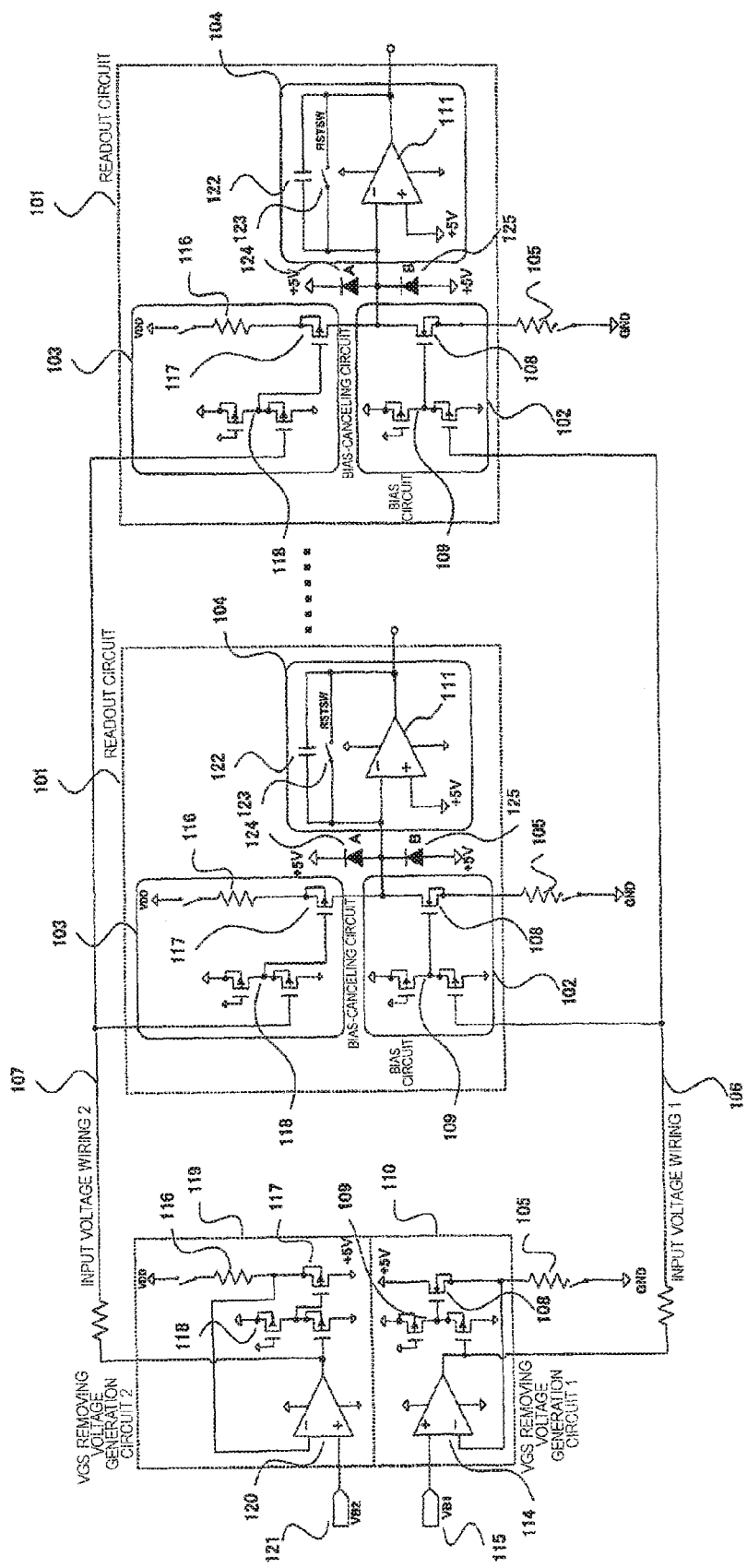
FIG. 5 is a diagram illustrating a structure of a readout circuit illustrated in FIG. 4.
Figure 6A:
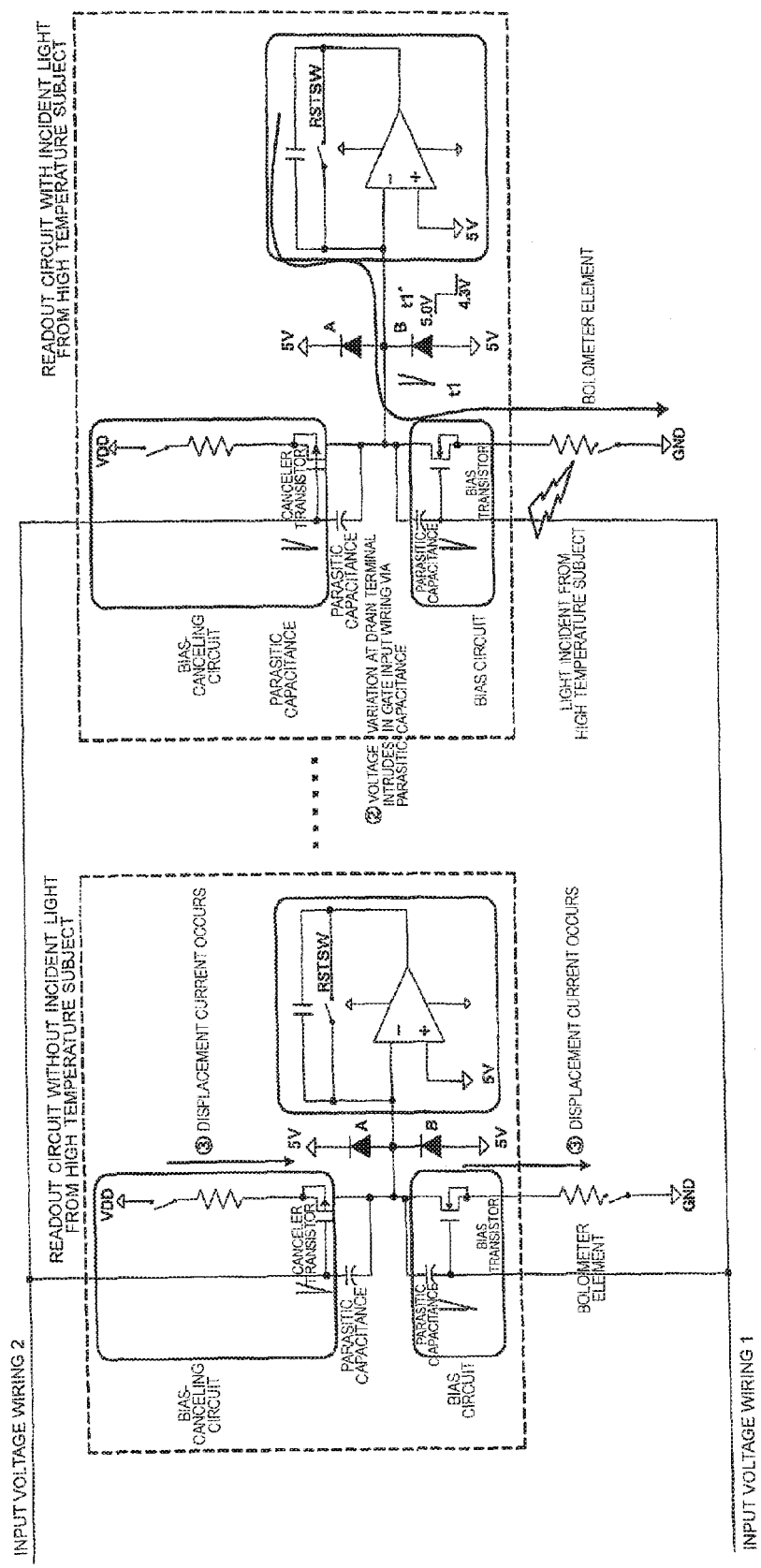
FIG. 6A is a circuit diagram illustrating a mechanism of high temperature aliasing and temperature drift in the readout circuit illustrated in FIG. 5.
Figure 6B:
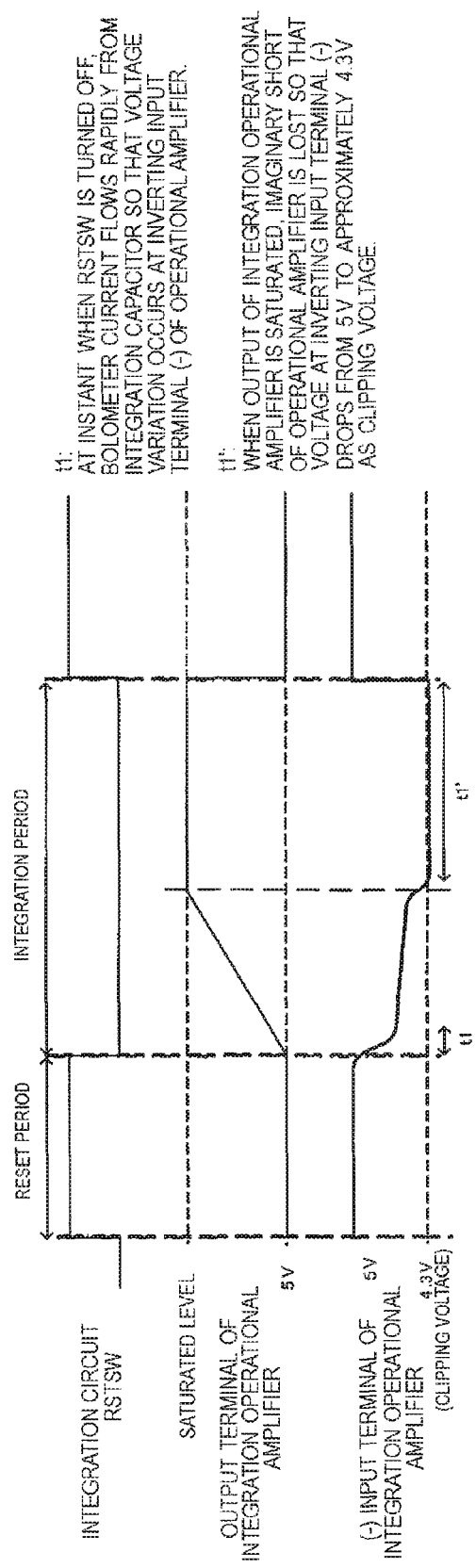
FIG. 6B is a signal waveform diagram illustrating a mechanism of high temperature aliasing and temperature drift in the readout circuit illustrated in FIG. 6A.

A structure of a readout circuit according to a first embodiment of this invention, which is applied to a bolometer infrared image pickup device, is illustrated in FIG. 1. Each readout circuit 301 includes a bias circuit 302 for applying a constant voltage to a bolometer element 305, a bias-canceling circuit 303 for removing offset currents of components other than a subject signal, an integration circuit 304 for integrating a subject signal, and a saturation-prevention circuit 309 for preventing saturation of an output voltage of the integration circuit 304. Note that, similarly to the circuit described above with reference to FIG. 5, a first input voltage wiring 1 (306) and a second input voltage wiring 2 (307) are respectively connected to the VGS removing voltage generation circuits 1 (110) and 2 (119) to which the input voltages VB1 and VB2 (315 and 321) are input, respectively, but illustration thereof is omitted.

The input voltage wirings 1 and 2 (306 and 307) and a reset signal wiring 312 are connected in common to each readout circuit 301, and hence the individual readout circuits 301 perform reading operations simultaneously in parallel.

The bias circuit 302 includes an NMOS transistor (hereinafter referred to as a bias transistor) 308 having a source connected to one terminal of the bolometer element 305, and applies a constant voltage to the bolometer element 305. Thus, a resistance variation of the bolometer element 305 is converted into a current value.

The bias-canceling circuit 303 includes a resistor element 316 having one terminal connected to a power source (VDD) and a transistor (hereinafter referred to as a canceler transistor) 317 having a source connected to the other terminal of the resistor element 316.

Here, the infrared signal has a large offset component, and a signal component from a subject exists on the offset component at a very small level. In order to remove this offset component, the bias-canceling circuit 303 is constituted.

Drains of the bias transistor 308 and the canceler transistor 317 are connected to an inverting input terminal (−) of an integration operational amplifier 324 and one terminal of an integration capacitor 322 in the integration circuit 304 via an input separation switch 325. The integration circuit 304 integrates a current variation of the bolometer element 305 described above. The other terminal of the integration capacitor 322 is connected to an output terminal of the integration operational amplifier 324. A non-inverting input terminal (+) of the integration operational amplifier 324 is connected to a reference voltage (VDD/2). Thus, the inverting input terminal (−) of the integration operational amplifier 324, namely the drains of the bias transistor 308 and the canceler transistor 317 via the input separation switch 325 are usually fixed to the reference voltage (VDD/2). A voltage of the integration capacitor 322 after the integration is extracted from the output terminal of the integration operational amplifier 324, and is sequentially output from each readout circuit 301 as the output signal.

The saturation-prevention circuit 309 compares the output voltage of the integration circuit 304 with a preset saturation prevention upper detection voltage (Vprev_sat_up), so as to control the input separation switch 325 in accordance with a result of the comparison. The saturation-prevention circuit 309 separates the drains of the bias transistor 308 and the canceler transistor 317 (connection point therebetween) from an input of the integration circuit 304 when the output voltage of the integration circuit 304 is higher than the saturation prevention upper detection voltage (Vprev_sat_up). In this way, the saturation-prevention circuit 309 suppresses a voltage variation of the inverting input terminal (−) in the integration operational amplifier 324 generated when the output voltage of the integration operational amplifier 324 is saturated. More specifically, the saturation-prevention circuit 309 includes a comparator 326 for comparing the output voltage of the integration circuit 304 with the saturation prevention upper detection voltage (Vprev_sat_up). The saturation-prevention circuit 309 further includes a set and reset (SR) latch 327 for holding an output of the comparator 326 and the input separation switch 325 for separating the drains of the bias transistor 308 and the canceler transistor 317 from the input of the integration circuit 304 depending on an output of the SR latch 327.

A non-inverting input terminal (+) of the comparator 326 is connected to the output terminal of the integration operational amplifier 324 and the integration capacitor 322, and an inverting input terminal (−) of the comparator 326 is connected to the saturation prevention upper detection voltage (Vprev_sat_up). In addition, an output terminal of the comparator 326 is connected to a set terminal (S) of the SR latch 327. The output of the comparator 326 becomes "High" when an output voltage of the integration operational amplifier 324 exceeds the saturation prevention upper detection voltage (Vprev_sat_up).

The reset signal wiring 312 is connected to a reset terminal (R) of the SR latch 327, and an output terminal (Q) of the SR latch 327 is connected to a control terminal of the input separation switch 325. Even when the set terminal (S) becomes "High" only at a moment while the reset terminal (R) is "Low", the output terminal (Q) of the SR latch 327 becomes "High". Even after the set terminal (S) returns to "Low", the output terminal (Q) holds "High".

Similarly, even when the reset terminal (R) becomes "High" only at a moment while the set terminal (S) is "Low", the output terminal (Q) of the SR latch 327 becomes "Low". Even after the reset terminal (R) returns to "Low", the output terminal (Q) holds "Low".

The input separation switch 325 is a single pole double throw (one circuit two contacts) switch, and the common terminal thereof is connected to the drains of the bias transistor 308 and the canceler transistor 317. A contact 1 of the input separation switch 325 is connected to the inverting input terminal (−) of the integration operational amplifier 324 and the integration capacitor 322. A contact 2 of the input separation switch 325 is connected to the reference voltage (VDD/2). The control terminal of the input separation switch 325 is connected to the output terminal (Q) of the SR latch 327.

When the output terminal (Q) of the SR latch 327 is "Low", the common terminal of the input separation switch 325 is connected to the contact 1 so that a current of the above-mentioned bolometer element 305, which has been varied, flows to the integration circuit 304.

When the output terminal (Q) of the SR latch 327 is "High", the common terminal of the input separation switch 325 is connected to the contact 2, and hence the drains of the bias transistor 308 and the canceler transistor 317 (connection point therebetween) are connected to the reference voltage (VDD/2). Therefore, the input of the integration circuit 304 is separated from the above-mentioned connection point so that a current does not flow to the capacitor 322 in the integration circuit 304.

In addition, a resetting switch (RSTSW) 323 is connected between the inverting input terminal (−) and the output terminal of the integration operational amplifier 324. After the integrated voltage is output from the capacitor 322, the switch 323 is turned on by a reset signal from the reset signal wiring 312. In this way, the output voltage of the integration operational amplifier 324 is set to the reference voltage (VDD/2) that is a voltage at the non-inverting input terminal (+).

Operation in Embodiment

An operation in the first embodiment is generally as follows. A variation of resistance of each bolometer element 305 is generated in accordance with intensity of infrared incident light from the subject and is detected as a difference between a bolometer current and a current of the bias canceling-circuit 303 determined by input voltages VB1 and VB2 (not shown in FIG. 1, see FIG. 5). The detected current difference is integrated by the integration circuit 304 and simultaneously undergoes current-to-voltage conversion to be output as a voltage value from the integration circuit 304.

The saturation-prevention circuit 309 detects an upper limit of the voltage value output from the integration circuit 304, and separates the input of the integration circuit 304 from a connection point between the bias circuit 302 and the bias-canceling circuit 303 by the input separation switch 325 before the output voltage of the integration circuit 304 is saturated.

Here, the SR latch 327 is disposed in the saturation-prevention circuit 309 for preventing chattering at a transition of the comparator 326. Therefore, when an influence of the chattering is small, the SR latch 327 is not necessary.

Specific operations of the bias circuit 302 and the bias-canceling circuit 303 are as follows. First, the input voltages VB1 and VB2 (see FIG. 5) are adjusted in a state where a shutter of the infrared image pickup device is closed (without incident light from the subject) so that a current flowing in the bolometer element 305 is balanced with a current flowing in the bias-canceling circuit 303. After that, the shutter is opened so as to extract only a current that has varied due to resistance variation of the bolometer element 305 caused by the incident light from the subject.

Figure 3A:
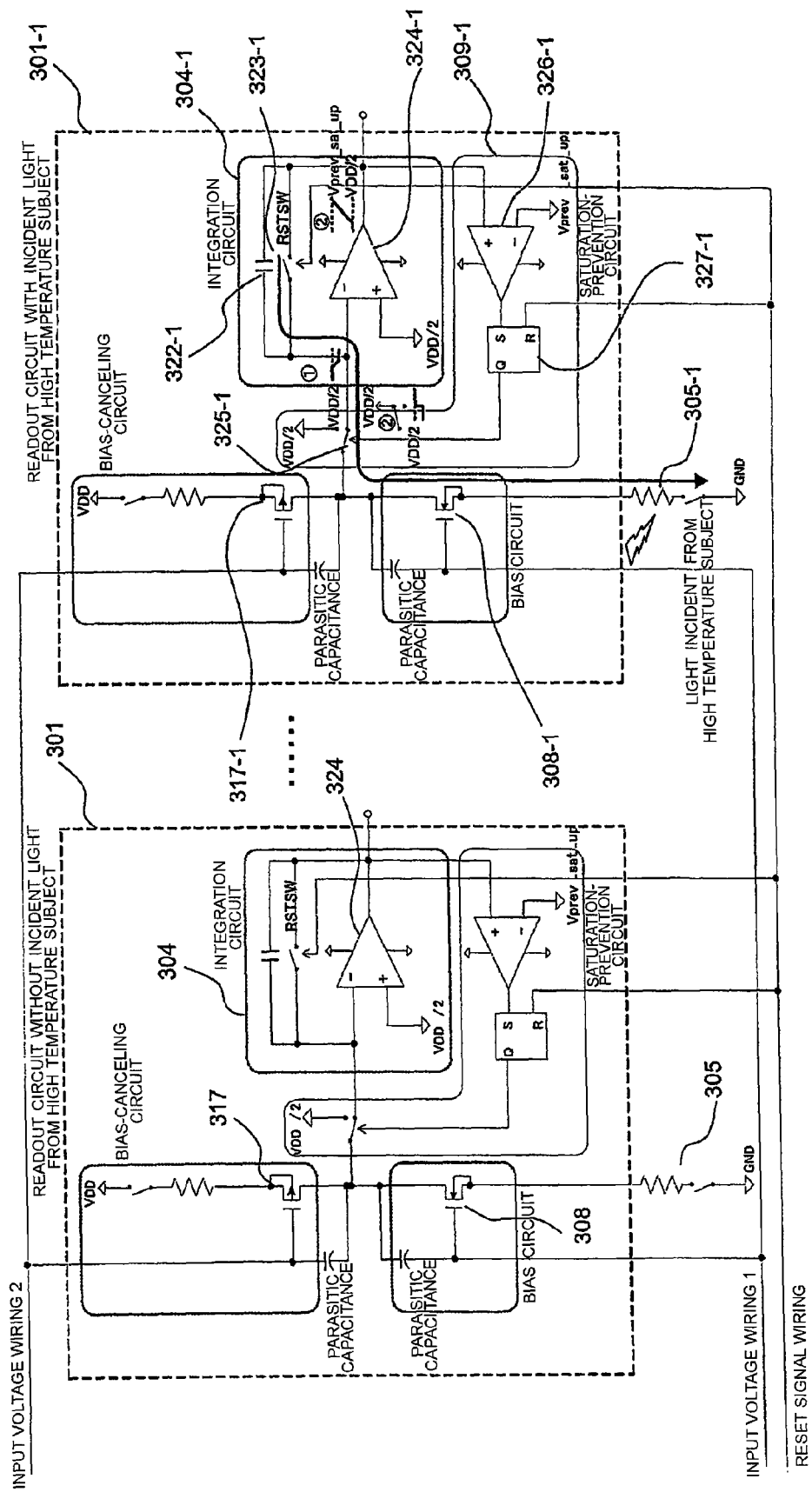
FIG. 3A is a circuit diagram illustrating an operation of one of the readout circuits illustrated in FIG. 1, when light enters from a high temperature subject.

An operation of the readout circuit when light enters from a high temperature subject is described in detail with reference to FIGS. 3A and 3B. FIG. 3A illustrates the readout circuit 301 connected to the bolometer element 305 which light does not enter from a high temperature subject and a readout circuit 301-1 connected to a bolometer element 305-1 which light enters from a high temperature subject.

When a resistance temperature coefficient of the bolometer element is negative, a resistance value of the bolometer element 305-1 is decreased by light entering from a high temperature subject, and hence a current flowing to the bolometer element 305-1 is increased. When integration in an integration circuit 304-1 is started, a current flows rapidly from a capacitor 322-1 in the integration circuit 304-1 to the bolometer element 305-1 through a path indicated by an arrow in the circuit on the right side of FIG. 3A at an instant when a resetting switch RSTSW (switch 323-1) is turned off. As a result, an imaginary short of the integration operational amplifier is lost, and a voltage variation (ΔV) occurs at an inverting input terminal (−) of an integration operational amplifier 324-1 and at drains of a bias transistor 308-1 and a canceler transistor 317-1 (connection point therebetween) that are connected to the inverting input terminal (−) of the integration operational amplifier 324-1 (period T1 of FIG. 3B).

A parasitic capacitor between a drain and a gate of the bias transistor 308-1 is connected between the inverting input terminal (−) of the integration operational amplifier 324-1 and the input voltage wiring 1. A parasitic capacitor between a drain and a gate of the canceler transistor 317-1 is connected between the inverting input terminal (−) of the integration operational amplifier 324-1 and the input voltage wiring 2. Therefore, a voltage variation at the inverting input terminal (−) of the integration operational amplifier 324-1 is differentiated and appears at the input voltage wirings 1 and 2 ((−)ΔVS1 of FIG. 3B).

Figure 3B:
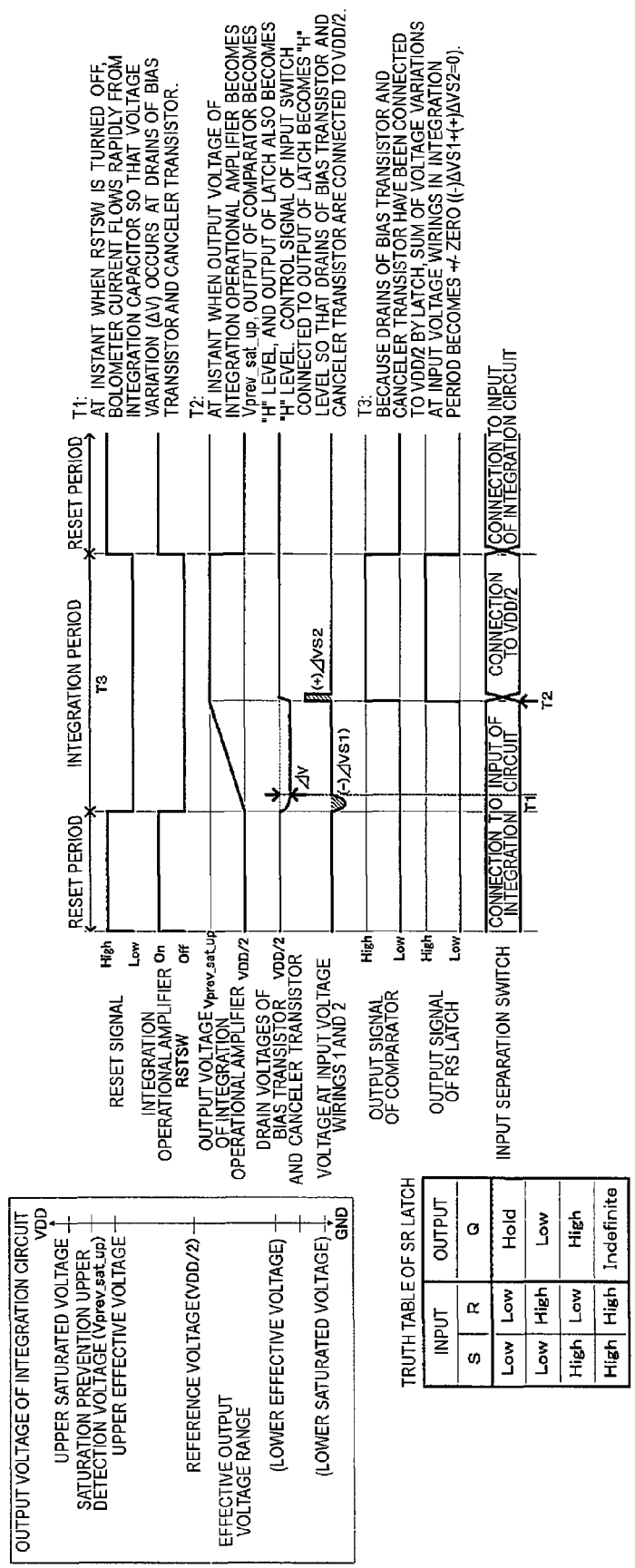
FIG. 3B is an output voltage and signal waveform diagram illustrating an operation of one of the readout circuits illustrated in FIG. 3A, when light enters from a high temperature subject.
Figure 4:
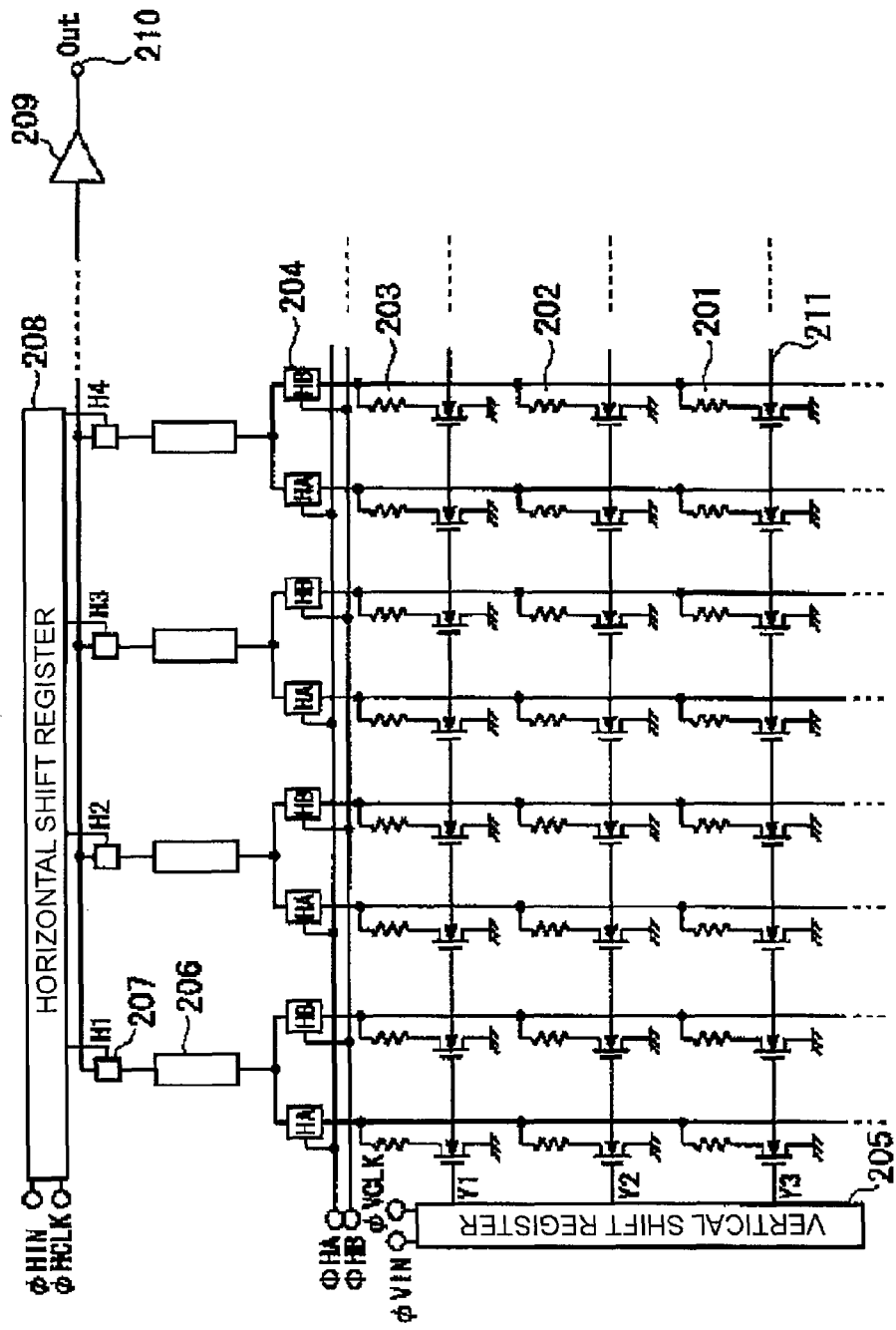
FIG. 4 is a circuit diagram partially illustrating a bolometer infrared image pickup device of Patent Literature 1.

Here, as illustrated in FIG. 3B, the saturation prevention upper detection voltage (Vprev_sat_up) is set to a value between an upper effective voltage and an upper saturated voltage of an output voltage of the integration circuit 304-1.

After that, when the output voltage of the integration operational amplifier 324-1 reaches the saturation prevention upper detection voltage (Vprev_sat_up), an output of a comparator 326-1 in a saturation-prevention circuit 309-1 becomes "High", and an output of an SR latch 327-1 connected to the comparator 326-1 is also held at "High". When the output of the SR latch 327-1 becomes "High", an input separation switch 325-1 is switched to connect the common terminal (drains of the bias transistor 308-1 and the canceler transistor 317-1) and the contact 2 (VDD/2), and an input of the integration circuit 304-1 is separated. When the input of the integration circuit 304-1 is separated, a current does not flow from the capacitor 322-1 in the integration operational amplifier 324-1. Therefore, the output voltage of the integration operational amplifier 324-1 is fixed to the saturation prevention upper detection voltage (Vprev_sat_up), and the inverting input terminal (−) of the integration operational amplifier 324-1 becomes imaginary short to have the reference voltage (VDD/2) again (period T2 of FIG. 3B).

In this case, a voltage variation at the drains of the bias transistor 308-1 and the canceler transistor 317-1 is differentiated by the parasitic capacitances and appears at the input voltage wirings 1 and 2 ((+)ΔVS2 of FIG. 3B).

The voltage variation at the drains of the bias transistor 308-1 and the canceler transistor 317-1 in an integration period varies from the reference voltage (VDD/2) to ΔV and returns to the original reference voltage (VDD/2). Therefore, a sum of the voltage variation components of the input voltage wirings at which the voltage variation is differentiated is +/−zero ((−)ΔVS1+(+)ΔVS2=0 of FIG. 3B).

In the readout circuits 301 connected to other bolometer elements 305 that light does not enter from a high temperature subject, the current generated when the voltage at the input voltage wiring is applied is integrated by the integration operational amplifier 324, but there is no influence on an integrated output voltage because a sum of the voltage variation components of the input voltage wirings in the integration period is zero.

Effect of Embodiment

An effect of the first embodiment is that it is possible, without the source follower circuit as described in Patent Literature 1, to obtain the same performance as in the case of having the source follower circuit with low noise, a small area, and low power consumption. The reason is that the use of the saturation-prevention circuit enables the voltage variation component of the input voltage wiring due to a high temperature subject or the like to be zero, and hence an effect of preventing high temperature aliasing can be obtained. In other words, because the saturation-prevention circuit prevents saturation of an output voltage of the integration circuit, it is possible to eliminate an influence of the saturation phenomenon of an output voltage of the integration circuit on the input voltage supplied to other readout circuits operating in parallel. Therefore, the same effect of preventing high temperature aliasing can be obtained as in the case of using the source follower circuit described in Patent Literature 1.

Further, because the saturation-prevention circuit only performs control of the input separation switch, noise in a comparator or a latch does not appear in the output voltage after the integration. Therefore, it is not necessary to increase a circuit area and power consumption so as to reduce noise, and hence it is possible to achieve low noise, small area, and low power consumption.

Other Embodiments

A second embodiment of this invention is described with reference to FIG. 2. The second embodiment also describes a structure of a readout circuit applied to the bolometer infrared image pickup device.

Figure 2:
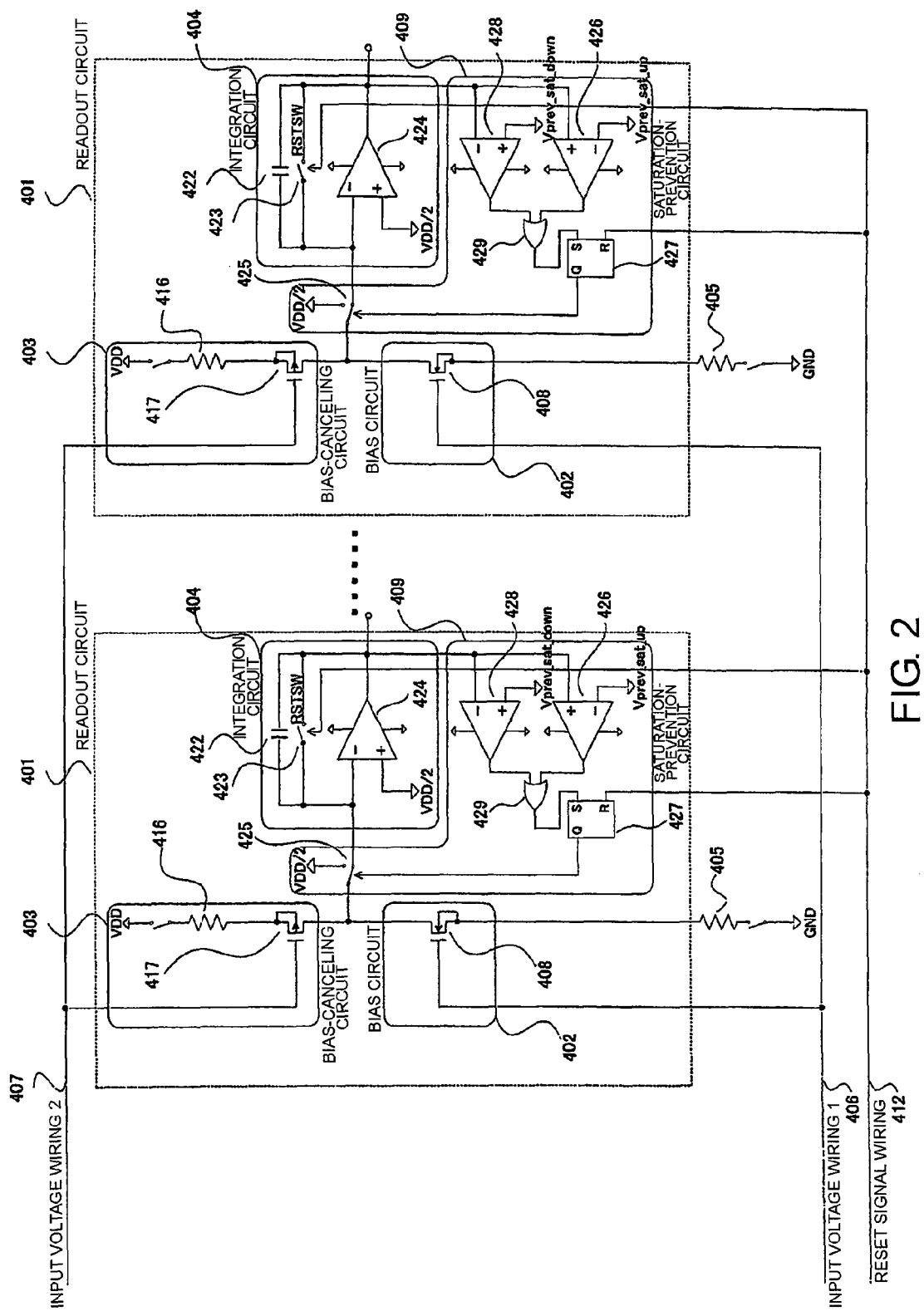
FIG. 2 is a diagram illustrating a structure of a readout circuit in a bolometer infrared image pickup device according to a second embodiment of this invention.

In FIG. 2, although reference numerals are different, structures of a bias circuit 402, a bias-canceling circuit 403, and an integration circuit 404 that constitute a readout circuit 401, and connections among a bolometer element 405, a first input voltage wiring 1 (406), a second input voltage wiring 2 (407), and a reset signal wiring 412 are the same as those in the first embodiment, and therefore description thereof is omitted. In addition, similarly to the first embodiment, the input voltage wiring 1 (406) and the input voltage wiring 2 (407) are connected to the VGS removing voltage generation circuits 1 (110) and 2 (119) to which the input voltages VB1 and VB2 (315 and 321) are input as described above with reference to FIG. 5, but illustration thereof is omitted.

In the circuit illustrated in FIG. 2, in order to prevent both high temperature aliasing and low temperature aliasing, a saturation prevention upper detection comparator (first comparator) 426 and a saturation prevention lower detection comparator 428 are used in a saturation-prevention circuit 409. In FIG. 2, an inverting input terminal (−) of the saturation prevention lower detection comparator (second comparator) 428 is connected to an output terminal of an integration operational amplifier 424 and a capacitor 422 in the integration circuit 404, and a non-inverting input terminal (+) of the saturation prevention upper detection comparator 426. On the other hand, a non-inverting input terminal (+) of the saturation prevention lower detection comparator 428 is connected to a saturation prevention lower detection voltage (Vprev_sat_down).

Here, the saturation prevention lower detection voltage (Vprev_sat_down) is set to a value between a lower effective voltage and a lower saturation voltage (see FIG. 3B) of an output voltage of the integration circuit 404. An OR circuit 429 takes a logical sum of an output signal of the saturation prevention lower detection comparator 428 and an output signal of the saturation prevention upper detection comparator 426 and outputs the result to a set terminal (S) of an SR latch 427. Similarly to the first embodiment, the reset signal wiring 412 is connected to a reset terminal (R) of the SR latch 427.

With this structure, when an output signal of the integration operational amplifier 424 is lower than the saturation prevention lower detection voltage (Vprev_sat_down) or is higher than the saturation prevention upper detection voltage (Vprev_sat_up), the drains of the bias transistor 408 and the canceler transistor 417 (connection point therebetween) are connected to the reference voltage (VDD/2) so that an input of the integration circuit 404 is separated. Therefore, voltage variation components of the first and second input voltage wirings 1 and 2 (406 and 407) due to light entering from a high temperature subject and light entering from a low temperature subject can be zero, and hence high temperature aliasing and low temperature aliasing do not occur.

In general, energy is lower as a subject temperature is lower. Therefore, in a case of a low temperature subject, the integration circuit is hardly saturated, but it may cause lower saturation depending on a gain of the integration circuit. In this case, because the sum of the voltage variation components of the input voltage wirings due to the lower saturation cannot be made zero in the first embodiment, low temperature aliasing appears. Therefore, it is preferred to adopt the second embodiment in which the sum of the voltage variation components of the input voltage wirings due to the lower saturation can be made zero by adding the saturation prevention lower detection comparator, though the circuit area is slightly increased. In some cases, only the lower saturation prevention may be provided.

This invention is described above with reference to a plurality of embodiments, but this invention is not limited to the embodiments described above. The structure and details of this invention can be variously modified as a person in the art will understand within the spirit and scope of this invention described in the claims.

This application claims priority from Japanese Patent Application No. 2011-201953, filed on Sep. 15, 2011, the entire disclosure of which is incorporated herein by reference.

A part or an entirety of the above-mentioned embodiments may be described as the following Supplementary Notes, but this invention is not limited thereto.

(Supplementary Note 1)

A semiconductor device, including:
  a bolometer element that receives light from a subject;
  a bias circuit that applies a bias voltage to the bolometer element;
  a bias-canceling circuit that removes an offset current of the bolometer element;
  an integration circuit connected to a connection point between the bias circuit and the bias-canceling circuit, that integrates a differential current between the bias circuit and the bias-canceling circuit; and
  a saturation-prevention circuit that prevents saturation of an output voltage of the integration circuit.

(Supplementary Note 2)

In the semiconductor device according to Supplementary Note 1, the saturation-prevention circuit has a function of comparing the output voltage of the integration circuit with a preset saturation prevention upper detection voltage, and separates the integration circuit from the connection point when the output voltage of the integration circuit is higher than the preset saturation prevention upper detection voltage, thereby preventing saturation of the output voltage of the integration circuit due to a fact that the subject has a high temperature.

(Supplementary Note 3)

In the semiconductor device according to Supplementary Note 2, the saturation-prevention circuit includes:
  a first comparator that compares the output voltage of the integration circuit with the preset saturation prevention upper detection voltage; and
  a switch inserted and connected between the connection point and the integration circuit so as to be controlled to be turned on and off by an output of the first comparator.

(Supplementary Note 4)

The semiconductor device according to Supplementary Note 3, further including a latch unit inserted and connected between the output of the first comparator and the switch.

(Supplementary Note 5)

In the semiconductor device according to Supplementary Note 2, the saturation-prevention circuit further has a function of comparing the output voltage of the integration circuit with a preset saturation prevention lower detection voltage, and separates the integration circuit from the connection point when the output voltage of the integration circuit is lower than the preset saturation prevention lower detection voltage, thereby preventing saturation of the output voltage of the integration circuit due to a fact that the subject has a low temperature.

(Supplementary Note 6)

In the semiconductor device according to Supplementary Note 5, the saturation-prevention circuit includes:
  a first comparator that compares the output voltage of the integration circuit with the preset saturation prevention upper detection voltage;
  a second comparator that compares the output voltage of the integration circuit with the preset saturation prevention lower detection voltage;
  a logic circuit configured to take a logical sum of an output of the first comparator and an output of the second comparator; and
  a switch inserted and connected between the connection point and the integration circuit so as to be controlled to be turned on and off by an output of the logic circuit.

(Supplementary Note 7)

The semiconductor device according to Supplementary Note 6, further including a latch unit inserted and connected between the output of the logic circuit and the switch.

(Supplementary Note 8)

An infrared image pickup device, including:
  a plurality of bolometer elements that receive light from a subject; and
  a plurality of readout circuits respectively connected to the plurality of bolometer elements,
    the plurality of bolometer elements and the plurality of readout circuits being connected to a first input voltage wiring and a second input voltage wiring,
  in which each of the plurality of readout circuits includes:
    a bias circuit that applies a bias voltage to corresponding one of the plurality of bolometer elements;
    a bias-canceling circuit that removes an offset current of the corresponding one of the plurality of bolometer elements;
    an integration circuit connected to a connection point between the bias circuit and the bias-canceling circuit, that integrates a differential current between the bias circuit and the bias-canceling circuit; and
    a saturation-prevention circuit that prevents saturation of an output voltage of the integration circuit.

(Supplementary Note 9)

In the infrared image pickup device according to Supplementary Note 8, the saturation-prevention circuit has a function of comparing the output voltage of the integration circuit with a preset saturation prevention upper detection voltage, and separates the integration circuit from the connection point when the output voltage of the integration circuit is higher than the preset saturation prevention upper detection voltage, thereby preventing saturation of the output voltage of the integration circuit due to a fact that the subject has a high temperature.

(Supplementary Note 10)

In the infrared image pickup device according to Supplementary Note 9, the saturation-prevention circuit includes:
- a first comparator that compares the output voltage of the integration circuit with the preset saturation prevention upper detection voltage; and
- a switch inserted and connected between the connection point and the integration circuit so as to be controlled to be turned on and off by an output of the first comparator.

(Supplementary Note 11)

The infrared image pickup device according to Supplementary Note 10, further including a latch unit inserted and connected between the output of the first comparator and the switch.

(Supplementary Note 12)

In the infrared image pickup device according to Supplementary Note 9, the saturation-prevention circuit further has a function of comparing the output voltage of the integration circuit with a preset saturation prevention lower detection voltage, and separates the integration circuit from the connection point when the output voltage of the integration circuit is lower than the preset saturation prevention lower detection voltage, thereby preventing saturation of the output voltage of the integration circuit due to a fact that the subject has a low temperature.

(Supplementary Note 13)

In the infrared image pickup device according to Supplementary Note 12, the saturation-prevention circuit includes:
- a first comparator that compares the output voltage of the integration circuit with the preset saturation prevention upper detection voltage;
- a second comparator that compares the output voltage of the integration circuit with the preset saturation prevention lower detection voltage;
- a logic circuit configured to take a logical sum of an output of the first comparator and an output of the second comparator; and
- a switch inserted and connected between the connection point and the integration circuit so as to be controlled to be turned on and off by an output of the logic circuit.

(Supplementary Note 14)

The infrared image pickup device according to Supplementary Note 13, further including a latch unit inserted and connected between the output of the logic circuit and the switch.

(Supplementary Note 15)

A method of preventing saturation of an output voltage of an integration circuit in an infrared image pickup device, the infrared image pickup device including:
- a plurality of bolometer elements that receive light from a subject; and
- a plurality of readout circuits respectively connected to the plurality of bolometer elements,
- the plurality of bolometer elements and the plurality of readout circuits being connected to a first input voltage wiring and a second input voltage wiring,
- each of the plurality of readout circuits including:
  - a bias circuit that applies a bias voltage to corresponding one of the plurality of bolometer elements;
  - a bias-canceling circuit that removes an offset current of the corresponding one of the plurality of bolometer elements; and
  - an integration circuit connected to a connection point between the bias circuit and the bias-canceling circuit, that integrates a differential current between the bias circuit and the bias-canceling circuit, the method including:
comparing the output voltage of the integration circuit with a preset saturation prevention upper detection voltage; and separating the integration circuit from the connection point when the output voltage of the integration circuit is higher than the preset saturation prevention upper detection voltage, thereby preventing saturation of the output voltage of the integration circuit due to a fact that the subject has a high temperature.

(Supplementary Note 16)

The method according to Supplementary Note 15, further including comparing an output voltage of the integration circuit with a preset saturation prevention lower detection voltage, and separating the integration circuit from the connection point when the output voltage of the integration circuit is lower than the preset saturation prevention lower detection voltage, thereby preventing saturation of the output voltage of the integration circuit due to a fact that the subject has a low temperature.

REFERENCE SIGNS LIST 101, 301, 401 readout circuit
102, 302, 402 bias circuit
103, 303, 403 bias-canceling circuit
104, 304, 404 integration circuit
108, 308, 408 bias transistor
117, 317, 417 canceler transistor
122, 322, 422 capacitor
123, 323, 423 resetting switch
111, 324, 424 integration operational amplifier
309, 409 saturation-prevention circuit
325, 425 input separation switch
326, 426, 428 comparator
327, 427 SR latch

The invention claimed is:

1. An infrared image pickup device, comprising:
a plurality of bolometer elements that receive light from a subject; and
a plurality of readout circuits respectively connected to the plurality of bolometer elements,
the plurality of bolometer elements and the plurality of readout circuits being connected to a first input voltage wiring, a second input voltage wiring, and a reset signal wiring,
wherein each of the plurality of readout circuits comprises:
a bias circuit that applies a bias voltage to corresponding one of the plurality of bolometer elements;
a bias-canceling circuit that removes an offset current of the corresponding one of the plurality of bolometer elements;
an integration circuit connected to a connection point between the bias circuit and the bias-canceling circuit, that integrates a differential current between the bias circuit and the bias-canceling circuit; and
a saturation-prevention circuit that prevents saturation of an output voltage of the integration circuit,
wherein the saturation-prevention circuit has a function of comparing the output voltage of the integration circuit with a preset saturation prevention upper detection voltage, and separates the integration circuit from the connection point when the output voltage of the integration circuit is higher than the preset saturation prevention upper detection voltage,
wherein the saturation-prevention circuit comprises:
- a first comparator that compares the output voltage of the integration circuit with the preset saturation prevention upper detection voltage; and
- a switch inserted and connected between the connection point and the integration circuit so as to be changed between a first state and a second state by an output of the first comparator, and wherein the switch connects the connection point to the integration circuit when the switch is in the first state, and the switch separates the connection point from the integration circuit and connects the connection point to a reference voltage when the switch is in the second state.

2. The infrared image pickup device according to claim 1, wherein the saturation-prevention circuit further comprises latch means inserted and connected between an output terminal of the first comparator and the switch, and the latch means becomes a set state by the output of the first comparator and holds the set state until the latch means receives a reset signal through the reset signal wiring.

3. The infrared image pickup device according to claim 1,
wherein the saturation-prevention circuit further has a function of comparing the output voltage of the integration circuit with a preset saturation prevention lower detection voltage, and separates the integration circuit from the connection point when the output voltage of the integration circuit is lower than the saturation prevention lower detection voltage,
wherein the saturation-prevention circuit further comprises:
- a second comparator that compares the output voltage of the integration circuit with the preset saturation prevention lower detection voltage; and
- a logic circuit configured to take a logical sum of the output of the first comparator and an output of the second comparator, and wherein the switch is changed between the first state and the second state by an output of the logic circuit.

4. The infrared image pickup device according to claim 1, wherein the integration circuit comprises:
- an integration operational amplifier having an inverting input terminal connected to the connection point through the switch, a non-inverting input terminal connected to the reference voltage, and an amplifier output terminal serving as an output of the readout circuit; and
- an integration capacitor having one end connected to the connection point through the switch and another end connected to the amplifier output terminal.

5. A method of preventing saturation of an output voltage of an integration circuit in an infrared image pickup device that includes a plurality of bolometer elements that receive light from a subject, and a plurality of readout circuits respectively connected to the plurality of bolometer elements, the plurality of bolometer elements and the plurality of readout circuits being connected to a first input voltage wiring and a second input voltage wiring, each of the plurality of readout circuits including a bias circuit that applies a bias voltage to corresponding one of the plurality of bolometer elements, a bias-canceling circuit that removes an offset current of the corresponding one of the plurality of bolometer elements, and an integration circuit connected to a connection point between the bias circuit and the bias-canceling circuit, that integrates a differential current between the bias circuit and the bias-canceling circuit, the method comprising:
- comparing, via a first comparator, the output voltage of the integration circuit with a preset saturation prevention upper detection voltage; and
- separating the integration circuit from the connection point, via a switch inserted and connected between the connection point and the integration circuit, when the output voltage of the integration circuit is higher than the preset saturation prevention upper detection voltage, thereby preventing saturation of the output voltage of the integration circuit, said switch changing between a first state and a second state by an output of the first comparator, wherein said switch connects the connection point to the integration circuit when the switch is in the first state, and the switch separates the connection point from the integration circuit and connects the connection point to a reference voltage when the switch is in the second state.

6. The method according to claim 5, further comprising:
- comparing the output voltage of the integration circuit with a preset saturation prevention lower detection voltage; and
- separating the integration circuit from the connection point when the output voltage of the integration circuit is lower than the saturation prevention lower detection voltage;

wherein the second saturation-prevention function is achieved by:
- a second comparator that compares the output voltage of the integration circuit with the preset saturation prevention lower detection voltage, and
- a logic circuit configured to take a logical sum of the output of the first comparator and an output of the second comparator, and wherein the switch is changed between the first state and the second state by an output of the logic circuit.

* * * * *